United States Patent [19]

Clatworthy

[11] Patent Number: 4,496,941
[45] Date of Patent: Jan. 29, 1985

[54] SWITCH PROTECTION DEVICE

[75] Inventor: Stuart C. Clatworthy, Bedfordshire, England

[73] Assignee: Restbury Limited, Bedfordshire, England

[21] Appl. No.: 337,719

[22] Filed: Jan. 7, 1982

[51] Int. Cl.³ ............................................. G08B 21/00
[52] U.S. Cl. .................................... 340/644; 340/654; 361/13
[58] Field of Search ...................... 340/644, 638, 654; 361/8, 13

[56] References Cited

U.S. PATENT DOCUMENTS 2,576,574 11/1951 Cochran .............................. 340/644

FOREIGN PATENT DOCUMENTS 888176 1/1962 United Kingdom .
1115588 2/1968 United Kingdom .
1224547 3/1971 United Kingdom .
1535216 12/1978 United Kingdom .

Primary Examiner—James L. Rowland
Assistant Examiner—Daniel Myer
Attorney, Agent, or Firm—Brumbaugh, Graves, Donohue & Raymond

[57] ABSTRACT

In the particular embodiments described in the specification a device is provided to protect against failure of a switch connected to a load and to give an alarm that the switch has failed. The device includes a circuit in parallel with the switch which contains a transistor and a diode to cause such voltage drop in the circuit as to prevent current flowing through a second diode when the switch is closed. If the switch fails open, the potential at the load side of the switch will drop, and the second diode will allow current to flow to the load through the circuit. The current flow produces a potential difference across the first diode to turn on another transistor to cause an alarm to be given. The device may be used to test such switches without affecting the load controlled by the switch.

7 Claims, 4 Drawing Figures

SWITCH PROTECTION DEVICE

The present invention relates to devices to protect against failure of switches. Such devices may also be used for testing switches without disturbing the system controlled by the switch.

In certain fields, it can be extremely hazardous or costly for a switch to fail without adequate warning or without circumvention being possible. It would of course, be possible to provide two, or even more, switches, in parallel or series depending on whether the switches are normally closed or normally open. Failure of one of these switches would not then affect the system. However such switches are costly and it may be possible for every switch to fail eventually without giving adequate warning. To take an example, in the fields of chemical processes or oil production platforms, there is generally provided a safety system by which complete shutdown of the apparatus or platform is controlled by a switch actuated by a control output giving a signal dependant on any one of a number of parameters. Since complete shutdown should be avoided except in extreme emergencies, it is obvious that the switch controlling such shutdown must be protected against its failure. It is therefore an object of this invention to provide a device which will obviate such problems. It is another object of this invention to provide a method of testing such switches without disturbing the loads controlled by the switches.

According to a first aspect of the present invention there is provided a device to ensure continuation of current supply to a load in the event of failure of a switch, the device comprising a circuit connected in parallel with the switch and comprising means to cause voltage drop thereby to produce a reduced potential in the circuit, and a diode arranged to prevent current flow in the circuit when the potential at the load side of the switch is higher than the reduced potential, and to allow current flow when said potential is reduced to a value lower than the reduced potential by virtue of the switch opening.

Preferably the device further comprises means to detect current flow in the circuit.

Advantageously the base of a transistor is connected to a point in the circuit between the voltage reducing means and the diode, the two other connections of the transistor forming part of an alarm circuit which conducts only when said transistor is biased on by current flow in said circuit caused by opening of the switch.

The alarm circuit may include a light emitting diode to give visible warning of switch opening.

According to a second aspect of the invention there is provided a method of testing a normally closed switch which comprises the steps of: connecting in parallel to said switch a circuit which comprises in series means to cause voltage drop thereby to produce a reduced potential in the circuit, a diode to prevent current flow in the circuit when the potential at the load side of the switch is higher than the reduced potential, and a connection point to the base of a transistor located between said means to cause a voltage drop and said diode, the two other connections of the transistor forming part of an alarm circuit; opening the switch; and checking the alarm circuit output.

According to a third aspect of the present invention there is provided a method of testing a normally open switch which comprises the steps of: connecting in parallel with a second normally open switch and the load, a circuit which comprises in series means to cause voltage drop thereby to produce a reduced potential in the circuit, a connection point to the base of a transistor, and a dummy load; connecting the other connections of the transistor into an alarm circuit; closing the normally open first-mentioned switch; and checking the alarm circuit output.

Embodiments of the invention will now be more particularly described by way of example and with reference to the accompanying drawings, in which.

Figure 1:
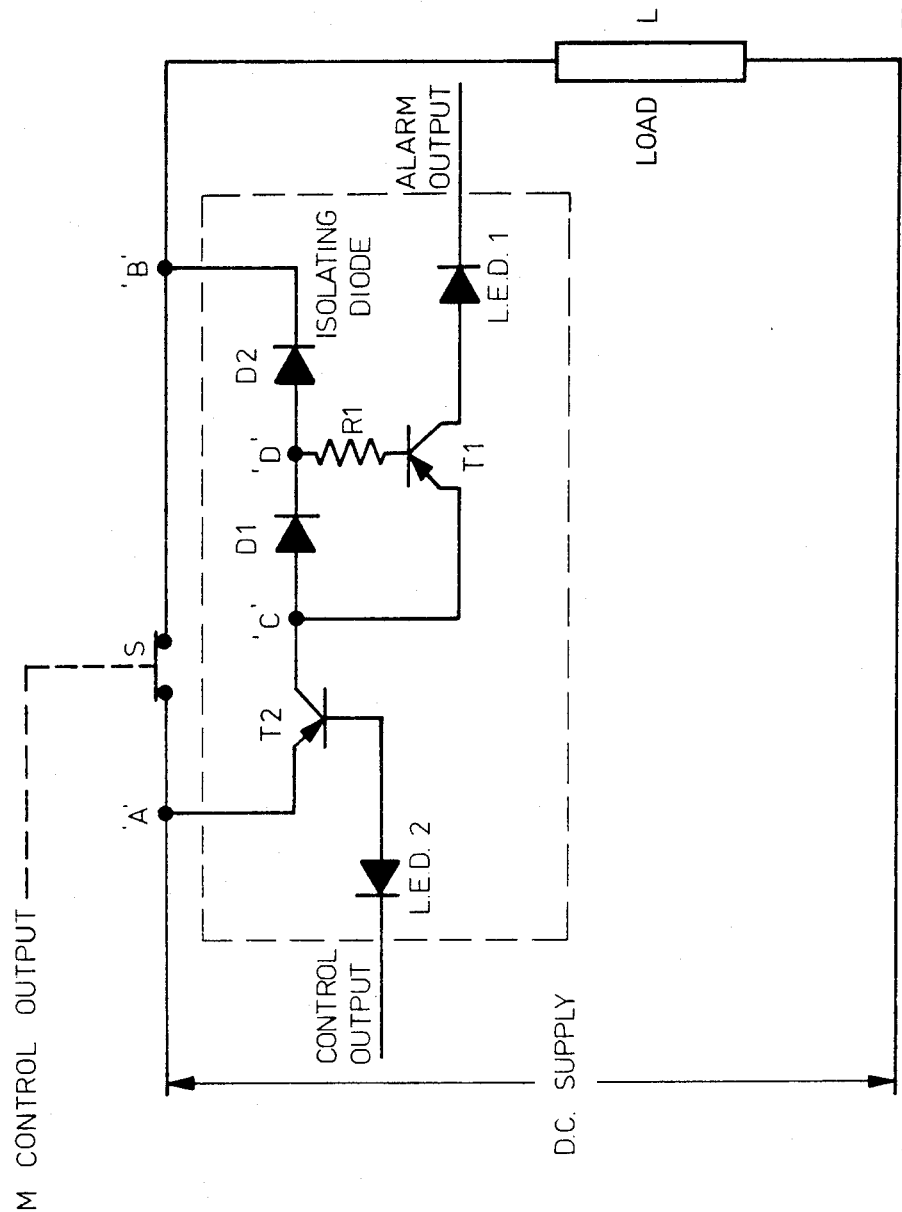
FIG. 1 is a circuit diagram of a switch and switch protection device embodying the present invention.

Referring now to the drawings, there is shown in FIG. 1 a basic circuit comprising a switch S and a device embodying the invention connected in parallel therewith between points A and B. In normal operation, the switch S is closed and the load L draws current from A to B through this switch. The device comprises, connected in sequence, a control transistor T2, connection point C, a diode D1, connection point D, and isolating diode D2. Transistor T2 and diode D1 cause such a voltage drop as to produce a reduced potential in the circuit whereby current is prevented from flowing through isolating diode D2. Thus while the switch S remains closed there is no current flow from A to B through C and D and therefore transistor T1 does not conduct.

Should the switch S fail open, the potential at B will drop and therefore diode D2 will conduct since the reduced potential at D will become greater than that at B. The load L will therefore be held on with current passing from A to B via C and D. This in turn will produce a potential difference across diode D1 which will turn on transistor T1, to illuminate a light emitting diode LED1 and to produce an alarm output.

The device of course can still be controlled by means of light emitting diode LED2 and transistor T2, and therefore if it is necessary for the load to be switched off, this can be easily accomplished.

If it should be desired, a similar device for protection of a similar switch connected in the return path from the load L can be provided by reversing the diodes and using negative equivalents of the transistors.

Figure 2:
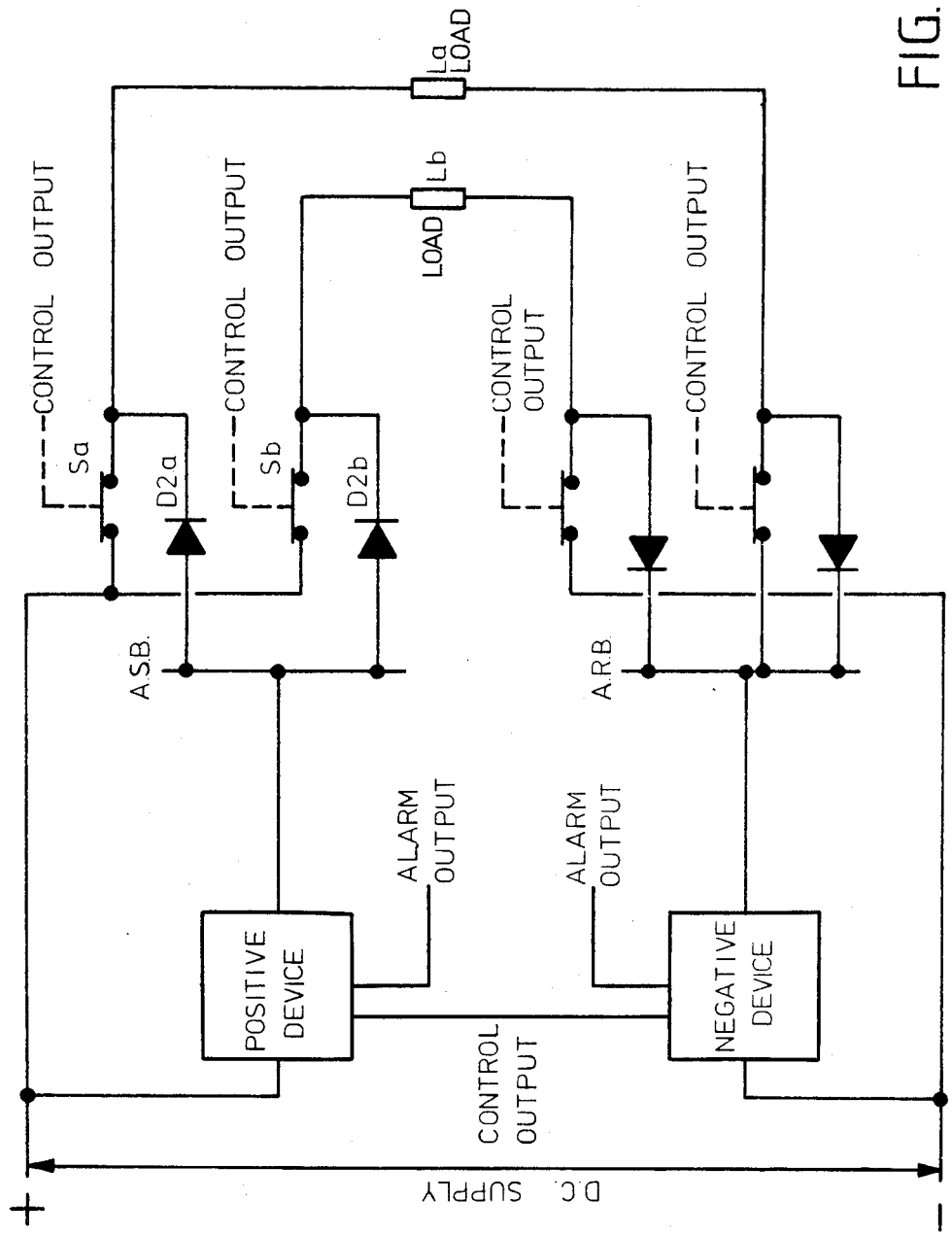
FIG. 2 is a circuit diagram to show how any one of such switch protection devices may be used to protect a number of switches.

As shown in FIG. 2, connection point D can be connected to an auxiliary supply bus ASB, from which connections can be taken to a number of isolating diodes, D2(a) and D2(b) for example, each of which isolating diodes protects a switch S(a), S(b) respectively. As can be seen therefore, a single device may protect a number of switches, each controlling a load. Each load La and Lb has two individual control outputs, one in its supply path, and one in its return path. The common part of the supply path and the common part of the return path are each provided with a separate protection device connected respectively to the auxiliary supply bus ASB and the auxiliary return bus ARB.

Figure 3:
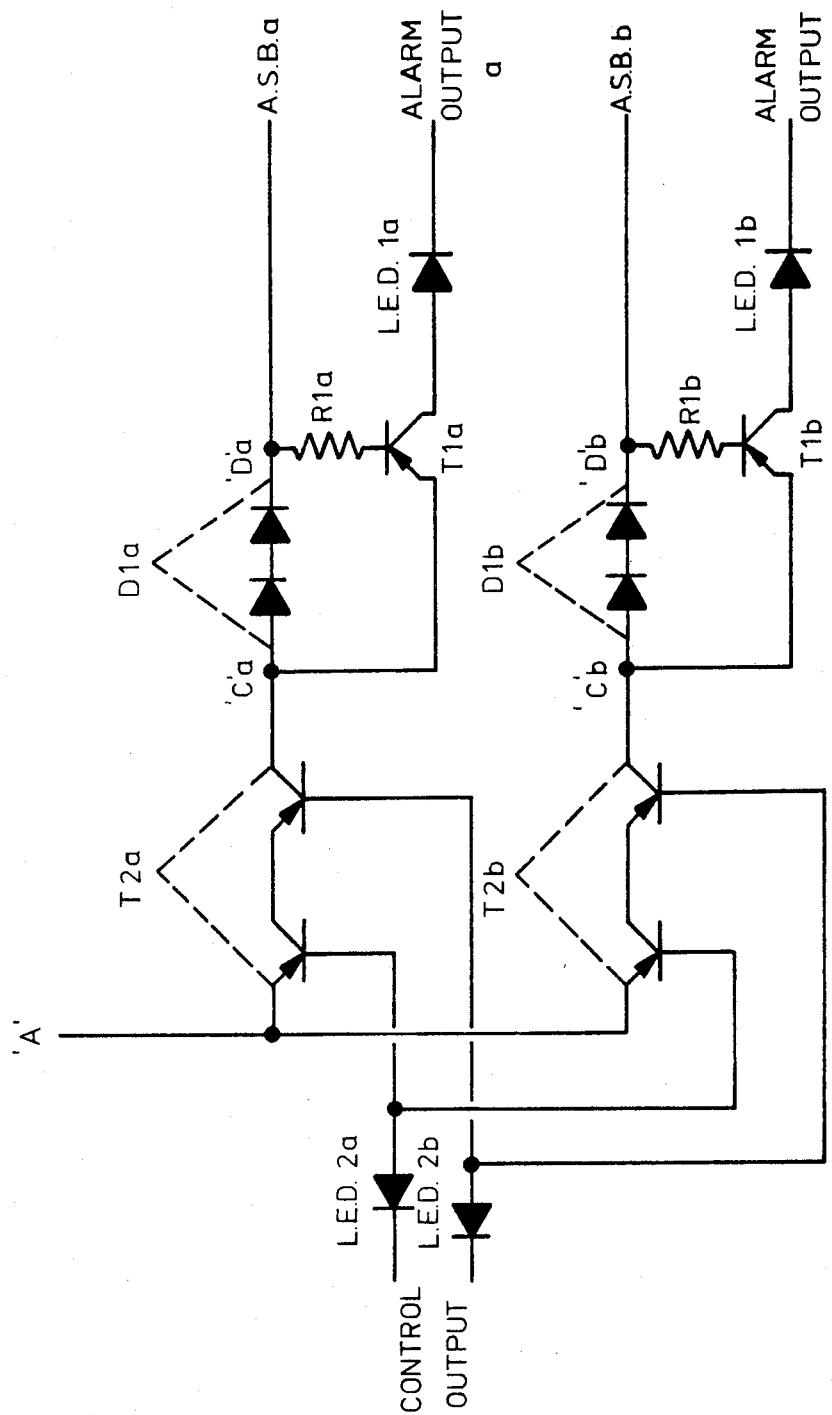
FIG. 3 is a circuit diagram to show an application of the protection device in which components are duplicated both in series and in parallel.

It can be seen that for the load to be switched off unintentionally, a switch and a protection device on the same side of the load must fail simultaneously. Similarly, for the load to become switched on when it is intended to be off, a switch or a protection device on the positive side of the load and a switch or protection device on the negative side of the load must simultaneously fail. In order to reduce the possibility of such occurrences, each component of the device may be duplicated both in series and in parallel, as can be seen from the circuit diagram of FIG. 3.

The device can also be used to test whether or not the switches are working. In the case of a normally closed switch, the switch is opened and the alarm circuit will give an output when the current bypasses the switch to flow through the protection device.

Figure 4:
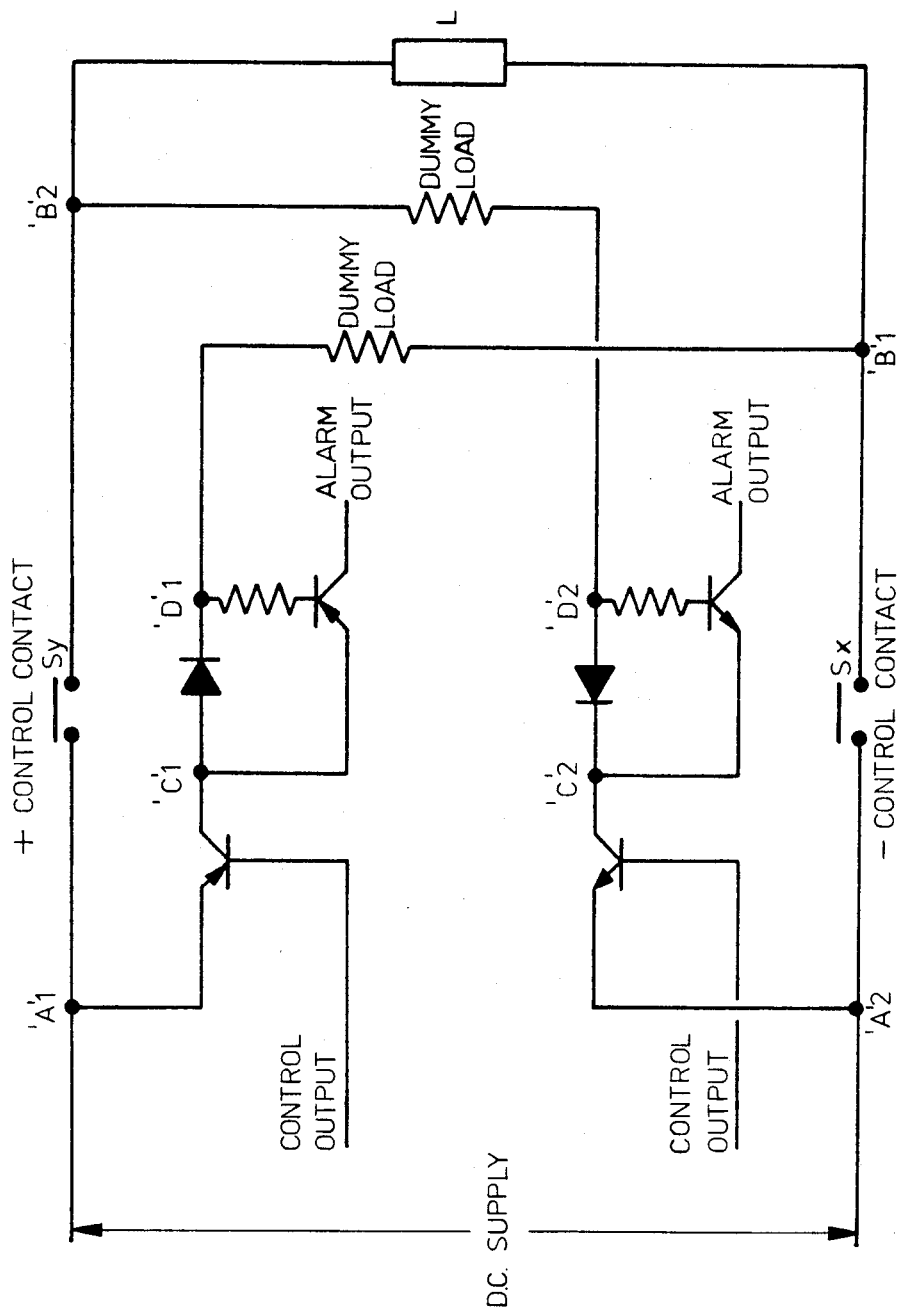
FIG. 4 is a circuit diagram to illustrate the method of testing normally open switches.

The method of testing a normally open switch Sx is shown in FIG. 4, wherein a circuit as described above but with the isolating diode replaced by a dummy load is connected in parallel with a second normally open switch Sy and the load L, and closing the switch Sx. If the switch is working correctly this will cause current to flow through the protection device and the dummy load causing an alarm output to be generated. Obviously since the load L is still connected in series with an open switch Sy, such an operation will not cause the load L to be energised. This method can be carried out to test switches on both positive and negative sides of the load.

I claim:

1. A supply circuit for supplying current to a load, comprising a load current cut-off switch which is connected in series with the load and which is responsive to a control output to switch from a normally conducting condition in which it conducts load current to the load to a non-conducting condition in which it cuts off load current to the load and a load current protection circuit having a load current path in parallel with the cut-off switch for maintaining a supply of load current to the load in the event that the cut-off switch fails in its non-conducting condition, the protection circuit comprising auxiliary switch means operative simultaneously with the cut-off switch in response to the control output to switch from a conducting condition permitting load current to flow in the load current path of the protection circuit to a non-conducting condition in which it cuts off load current through the load current path of the protection circuit, a switching diode so connected in the load current path of the protection circuit and so biased that with the auxiliary switch means in its conducting condition the switching diode cuts off load current through the load current path of the protection circuit when the cut-off switch is conducting load current and conducts load current through the load current path of the protection circuit when the cut-off switch fails to conduct load current, and an alarm circuit responsive to conduction of load current through the load current path of the protection circuit to generate an alarm signal indicating switch failure.

2. A circuit according to claim 1, wherein the protection circuit includes voltage drop means in the load current path of the protection circuit, and wherein the switching diode is connected in series with the voltage drop means and is biased to its non-conducting condition by the voltage drop across the voltage drop means.

3. A circuit according to claim 1, wherein the protection circuit includes a biasing diode connected in the load current path of the protection circuit and wherein the alarm circuit includes an alarm switching transistor which is turned on by the voltage across the biasing diode produced by load current flowing therethrough.

4. A circuit according to claim 3, wherein the alarm circuit includes a light-emitting diode which produces a visible warning of switch failure when the alarm switching transistor is turned on.

5. A circuit according to claim 4, wherein the auxiliary switch means comprises an auxiliary switching device connected in the load current path of the protection circuit.

6. A circuit according to claim 5, wherein the auxiliary switching device comprises an auxiliary switching transistor which is turned off in response to the control output.

7. A circuit according to claim 6, wherein the switching diode is biased to its non-conducting condition by the voltage drop across the auxiliary switching transistor and the biasing diode.

* * * * *